United States Patent [19]

Matsuoka et al.

[11] Patent Number: 5,009,609
[45] Date of Patent: Apr. 23, 1991

[54] CONTACT SHUTTER DEVICE IN IC SOCKET

[75] Inventors: Noriyuki Matsuoka; Junji Ishida, both of Tokyo, Japan

[73] Assignee: Yamaichi Electric Mfg. Co., Ltd., Tokyo, Japan

[21] Appl. No.: 413,389

[22] Filed: Sep. 27, 1989

[30] Foreign Application Priority Data

Sep. 30, 1988 [JP] Japan ................... 63-248614

[51] Int. Cl.[5] .......................................... H01R 13/62
[52] U.S. Cl. ........................ 439/73; 439/331; 439/264
[58] Field of Search ............... 439/70, 72, 73, 264, 439/269, 330, 331

[56] References Cited

U.S. PATENT DOCUMENTS

| 4,715,823 | 12/1987 | Ezura et al. | 439/269 X |
| 4,799,897 | 1/1989 | Mogi et al. | 439/264 |
| 4,801,273 | 1/1989 | Ikeya et al. | 439/264 X |
| 4,846,704 | 7/1989 | Ikeya | 439/73 X |

FOREIGN PATENT DOCUMENTS 62-93964 4/1987 Japan .
62-111673 7/1987 Japan .

Primary Examiner—Steven C. Bishop
Attorney, Agent, or Firm—Wenderoth, Lind & Ponack

[57] ABSTRACT

An IC socket includes a socket body having a plurality of contacts arranged in such a manner as to contact terminal members of an IC package. A contact shutter member is vertically movably mounted on the socket body and adapted, when lowering, to push the contacts against their elastic property so that the contacts will be displaced backward and downward to remove the contact relation. A contact shutter device in the IC socket is characterized by each of the contact having a contact piece portion extending upward from a fixedly embedded portion thereof through a curved spring piece, a cantilever arm extending backward from the contact piece portion, the cantilever arm being provided with a pressing force receiving portion formed on a free end portion thereof and pushed down by the contact shutter member, and a push-start point of the pressing force receiving portion by the contact shutter device being set to a position which is higher than a contact point of the contact piece portion with respect to the terminal members.

5 Claims, 4 Drawing Sheets

CONTACT SHUTTER DEVICE IN IC SOCKET

BACKGROUND OF THE INVENTION

1. Field of the Invention

This invention relates to an improvement on a contact shutter device in which contacts are pressed as to be displaced backward and downward by a lowering movement of the contact shutter device mounted on a socket body in order to cancel a contact relation with an IC package.

2. Brief Description of the Prior Art

In Japanese Utility Model Early Laid-open Publication No. Sho 62-111673, the contact is provided with a contacting piece portion formed on an upper end of a curved spring piece, and this contacting piece portion is pressed so as to be displaced backward and downward by the lowering movement of a contact shutter member so that its contact relation with a terminal member of an IC package would be broken.

The above-mentioned prior art aims at mounting and removing the IC package with ease by displacing the contacting piece portion of the contact backward and downward and bringing it to a position where the contacting piece portion of the contact would not interfere with the terminal member of the IC package to release the restraint of the IC package. With the above-mentioned construction of the prior art, however, a lot of useless components of forces for vertically pushing down the contacting piece portion are generated when the contacting piece portion is pushed down, and the push-down force cannot be favorably converted to a backward and downward displacement of the contact. The curved spring piece does not effectively contribute to the backward and downward displacement of the contact. Moreover, there is a fear that excessive generation of components of the vertical push-down force causes the contact to be deformed.

It also has problems such as the excessive push-down force to the shutter member jeopardizing the smooth operation of the device.

There is also proposed another example wherein the contact is provided with a pressing force receiving portion by a contact shutter member projecting from a waist portion below the contacting piece portion of the contact, as disclosed, for example, in Japanese Patent Early Laid-open Publication No. Sho 62-93964. However, as the rigidity becomes extremely high on the side of the contact which is fixedly embedded, the push-down operation of the shutter member becomes very heavy for a socket having many poles, and a space for inserting the push-down portion of the shutter member deep into the back of the contact is required, thus resulting in a large size of the device.

SUMMARY OF THE INVENTION

The present invention provides means for properly solving the above-mentioned problems inherent in the prior art.

As a means for solving the above problems, a cantilever arm is extended backward of a contacting piece portion of a contact, the cantilever arm being provided with a pressing force receiving portion formed on a free end portion thereof. A press start point of the pressing force receiving portion is set to be in a higher position than the contact point of the contacting piece portion.

Also, as a means for solving the above problems, the press point of the pressing force receiving portion of the free end portion of the cantilever arm is disposed backward of a curved spring piece adapted to support the contacting piece portion of the contact.

According to the present invention, a pressing force is applied to the pressing force receiving portion by a contact shutter member. When the pressing force is applied, the pressing force receiving portion displaces the contacting piece portion backward and upward while itself displacing backward and downward with an orbit from a position past the upper dead point of a circle about the contact point of the contacting piece portion, toward the back of a side dead point, so as to separate the contacting piece portion apart from the terminal member without fail.

According to the present invention, by applying the pressing force to the pressing force receiving portion on the upper position, sufficiently backwardly separated from the contacting piece portion through the cantilever arm, the pressing force can be favorably converted to the backward and upward displacing force of the contacting piece portion. The curved spring piece, adapted to support the contacting piece portion, is effectively used for backward and upward displacement of the contact. Accordingly, a sufficient backward and upward displacement of the contact can be ensured by a limited push-down amount of the contact shutter member.

Furthermore, according to the present invention, because pressing force is applied to the pressing force receiving portion by the contact shutter member at a position sufficiently backwardly separated from the contacting piece portion through the cantilever arm, a harmful component of force vertically pushing down the contacting piece portion can be effectively prevented from occurring, and a correct non-interfering position with respect to the IC package can be obtained. In addition, the push-down operating force can be reduced.

Various advantages and features which characterize the present invention are pointed out with particularity in the claims annexed hereto and form a part hereof. However, for a better understanding of the present invention, its advantages, and objects attained by its use, reference should be had to the drawings, which form a further part hereof, and to the accompanying descriptive matter, in which there is illustrated and described a preferred embodiment of the present invention.

DETAILED DESCRIPTION OF THE EMBODIMENT

The embodiments of the present invention will be described in detail with reference to FIGS. 1 through 7 of the accompanying drawings. A socket body 1 has a plurality of contacts 4 which are arranged in such a manner as to contact a plurality of terminal elements of an IC package 2.

Figure 5:
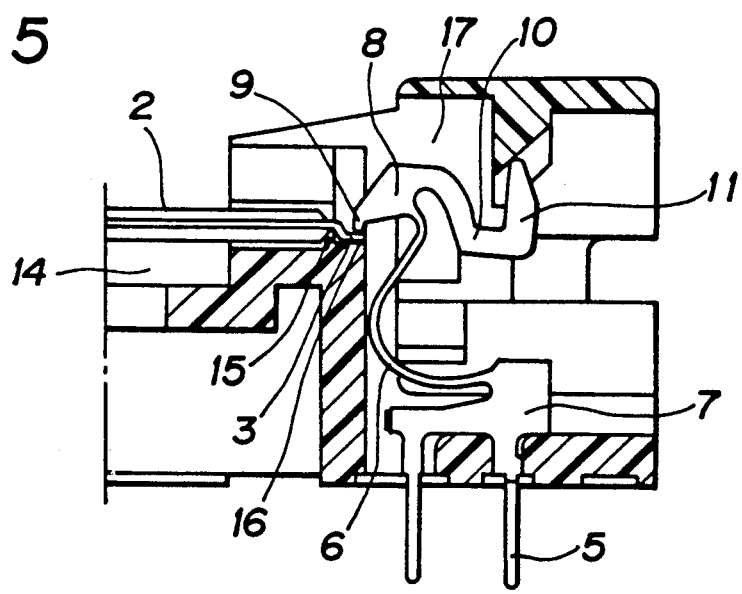
FIG. 5 is a sectional view of the IC socket showing the contact relation with the IC package after the push-down operation is cancelled.

The terminal elements 3 of the IC package 2, as shown in FIG. 5, have front ends projecting sideward generally in parallel relation with each other from opposite sides and bent in two steps, extending generally in a horizontal direction.

Figure 3:
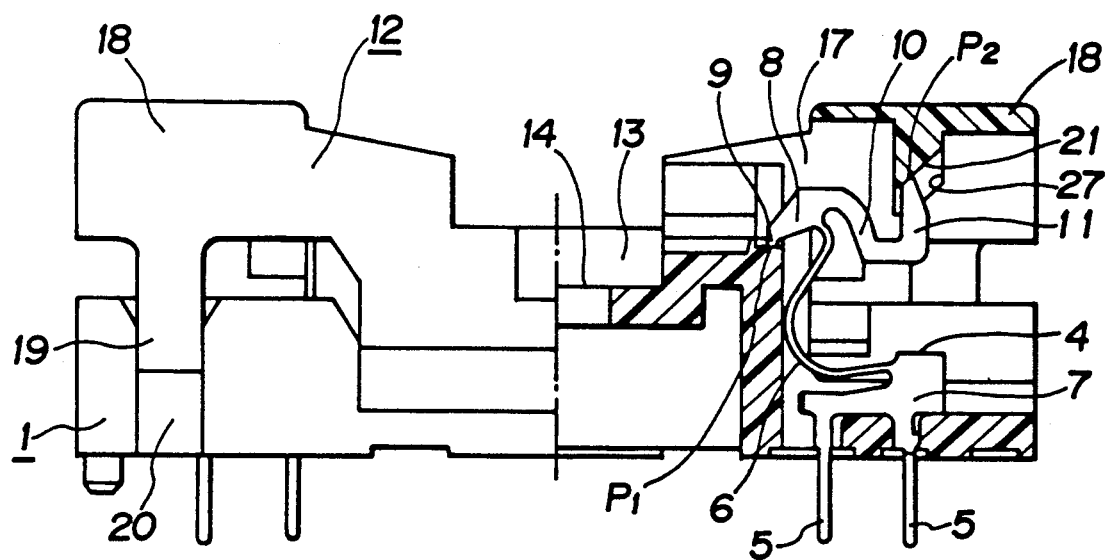
FIG. 3 is a sectional view of the IC socket before a push-down operation.
Figure 7:
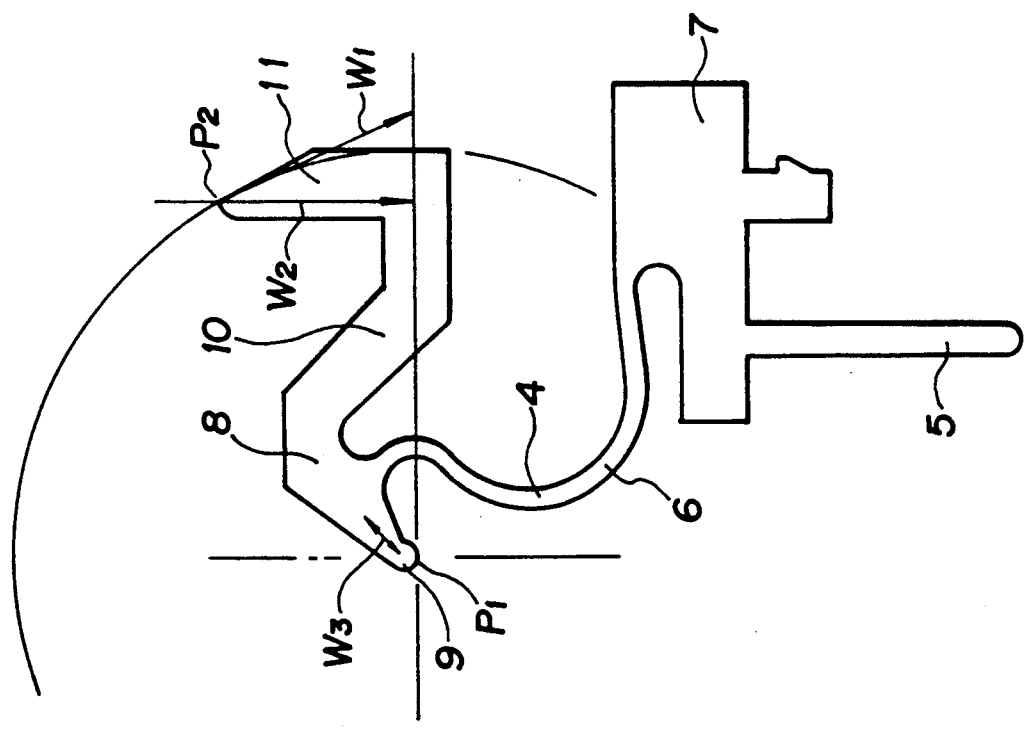
FIG. 7 is a side view of a contact.

Also, each of the contacts 4, as shown in FIGS. 3 and 7, has a male terminal 5 extending downward from a fixed end 7 thereof embedded in the socket body 1 and projecting downward from the socket body, and a curved spring piece 6 extending continuously upward from the fixed end 7. The curved spring piece 6 is expanded forward (toward the side of the IC package 2), and the curved spring piece 6 is provided with a contacting piece portion 8 continuous to an upper end of the curved spring piece 6. The curved spring piece 6 extends forward toward the IC package accommodating portion from the fixed end 7 up to the contacting piece portion 8, the curved spring having a double curve with a first concave portion adjacent the fixed end 7 facing away from the contacting piece portion 8 and a second concave portion adjacent and facing toward the contacting piece portion 8. The contacting piece portion 8 is projected toward the expanding side (forward side) of the curved spring piece 6 and has a contacting lug 9 formed on the front end thereof, facing downward.

The contact 4 is provided with a cantilever arm 10 continuous from an upper end of the contact 4, i.e., continuous backward from the contacting piece portion 8. The cantilever arm 10 is continuous at one end thereof to the contact piece portion 8 and has a free end at the other end. A pressing force receiving portion 11 to be pressed and moved by a contact shutter member, as will be described, is formed on the free end portion of the cantilever arm 10. The pressing force receiving portion 11 is formed with a projecting piece projecting upward.

A press point on an upper end of the upwardly projecting piece of the pressing force receiving portion 11 is represented by $P_2$ in FIG. 7, and a contact point on a lower end of the contacting lug 9 of the contacting piece portion 8, where the contacting lug 9 contacts with the terminal member 3 of the IC package 2, is represented by $P_1$. The press point $P_2$ is set such that it is located in a higher position than a horizontal line passing across the contact point $P_1$. The correlation between the contact point $P_1$ and the press point $P_2$, wherein the former is in the upper position and the latter is in the lower position, is determined by the extending direction of the cantilever arm 10 and the length of the projection of the pressing force receiving portion 11.

The illustrated cantilever arm 10 is extended downward exceeding the contact point $P_1$ and then bent like a hook to form the upward projecting piece (pressing force receiving portion 11).

Preferably, the extending length of the cantilever arm 10 is properly selected such that the press point $P_2$ of the pressing force receiving portion 11 is located behind the curved spring piece 6.

Figure 4:
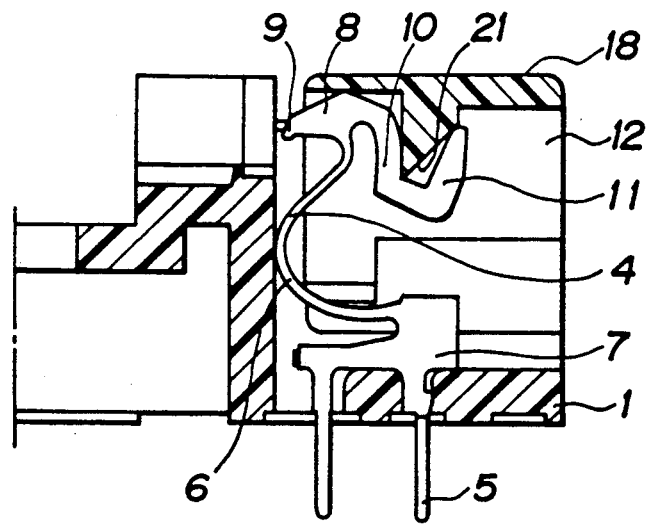
FIG. 4 is a sectional view of the IC socket after the push-down operation.

FIGS. 3 through 5 show the contact 4, which is of a type contacting at one of its surfaces. The contacting lug 9 of the contacting piece portion 8 is urgedly contacted with the upper surface of the front end of the terminal member 3, supported by a terminal supporting seat 16, from above at angles as shown by an arrow $W_3$ of FIG. 7.

Figure 6:
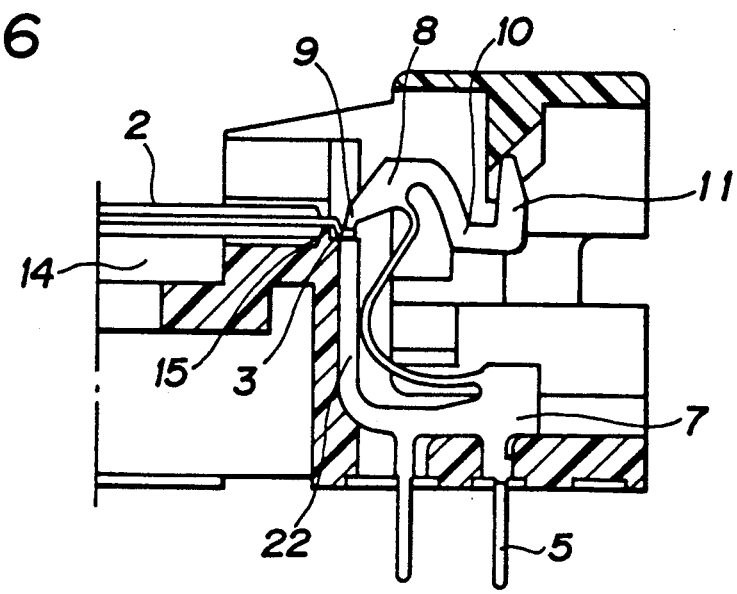
FIG. 6 is a section view of another embodiment showing a contact relation of an IC socket with an IC package.

Also, FIG. 6 shows a contact 4 of a type contacting at both its surfaces, as illustrated. The fixed end 7 is provided with a contact piece 22 erected upward to support a lower surface of a front end portion of the terminal member 3 of the IC package 2. The contacting piece portion 8 is urged to contact the upper surface of the front end portion to clamp the upper and lower surfaces of the terminal member 3 to obtain a reliable contact. Reference numeral 12 denotes a contact shutter member adapted to render a push-down force to the pressing force receiving portion 11 of the contact 4. The contact shutter member 12 is vertically movably disposed on the socket body 1.

Figure 1:
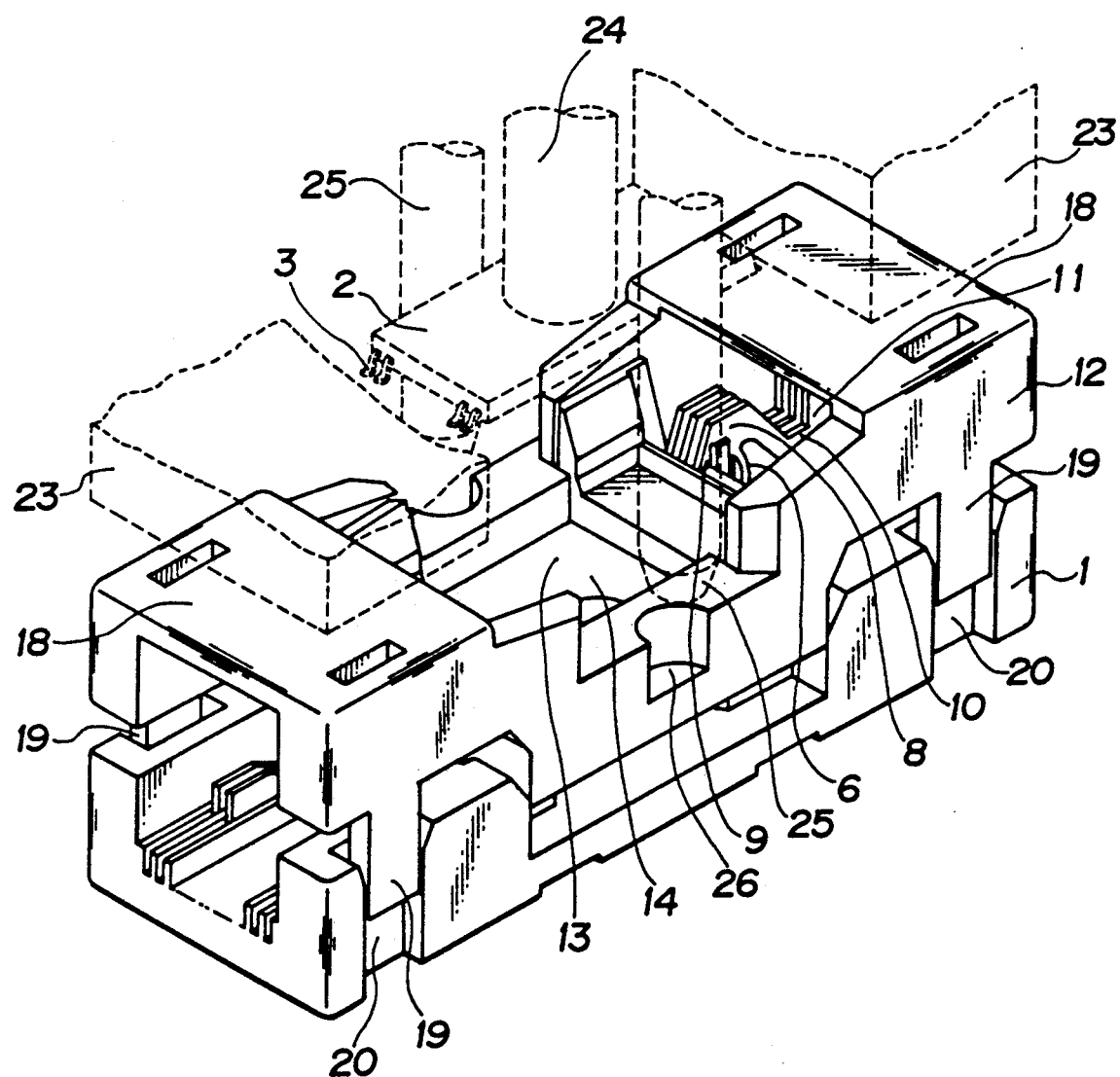
FIG. 1 is a perspective view of an IC socket showing an embodiment of the present invention.
Figure 2:
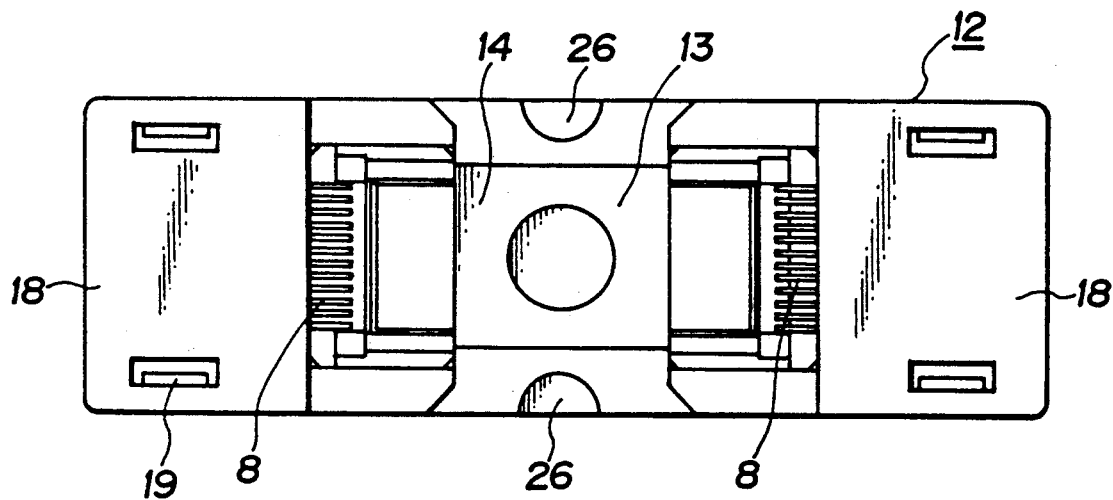
FIG. 2 is a plan view of the IC socket of FIG. 1.

The contact shutter member 12, as shown in FIGS. 1 and 2, has an IC accommodating window 13 at its central portion. An IC mounting portion 14 of the socket body 1 is formed immediately under the IC accommodating window 13. The IC mounting portion 14 is provided with a ridge 15 adapted to support the substrate portion of the terminal member 3 of the IC package 2 so as to correctly position the IC package 2 by regulating the sides of the body of the IC package 2 or the bent stepped-portion of the terminal member 3 while supporting the terminal member 3 with the ridge 15. At this time, in the embodiment of FIGS. 3 through 5, the front end portion of the terminal member 3 is supported by and held in a predetermined position by the terminal supporting seat 16. Similarly, in the embodiment shown in FIG. 6, the front end of the terminal member 3 is supported by the contact piece 22. The positioning ridge 15 may be designed such that is does not support the terminal member 3 but it restrains only the sides of the body of the IC package 2.

The contacts 4 are juxtaposed with each other along opposite pieces of the IC mounting portion 14. The contacting piece portions 8 of the contacts 4 are accommodated in an opening portion 17 which is formed on the external side of the terminal supporting seat 16, and in the embodiment shown in FIGS. 3 through 5, the contacting lugs 9 are abutted against the outer surface of the terminal supporting seat 16. On the other hand, in the embodiment shown in FIG. 6, the contacting lugs 9 are abutted against the contact pieces 22 and held in a state where they store resilient force. In other words, they are held in a so-called preloaded state.

Also, the contact shutter member 12 has a pair of push-down operating portions on both outer sides of the IC accommodating window 13. The push-down operating portion 18 is provided with a pair of engaging fingers 19 hanging down from its opposite side walls, and the engaging fingers 19 are guided in guide grooves 20 formed in the opposite side walls of the socket body 1, so that the engaging fingers 19 can be vertically moved along the guide groove 20. The contact shutter member 12, when lifted up by a predetermined amount, then causes engaging claws formed on the front ends of the engaging fingers 19 to be engaged with stepped portions formed on the upper end of the guide groove 20 to set and determine a lifting dead point of the shutter member 12.

The contact shutter member 12 is vertically movably mounted on the socket body 1 by the above-exemplified connecting means, i.e., the engaging fingers 19. In the mounted state, a corresponding state exists between the IC accommodating window 13 and the IC mounting portion 14 of the socket body 1. Furthermore, the pressing force receiving portion 11 of the contacts 4 and a press portion 21, as will be described, are brought in to a corresponding state, and the push-down operating portion 18 is brought to an upper and opposite position with respect to the pressing force receiving portion 11 of the contact 4.

The push-down operating portion 18 is provided with a partition wall 27 projecting downward between the adjacent pressing force receiving portions 11 of the contact 4. The press portion 21 is formed on a valley portion between the adjacent partition walls 27 for rendering a pressing force to the pressing force receiving portion 11.

The press portion 21 is an inclined surface rising backward of the contact 4. When the push-down force is applied to the push-down operating portion 18 of the contact shutter member 12, and the press portion 21 vertically descends, the press point $P_2$ of the pressing force receiving portion 11 is moved to the upper end side (FIG. 4) of the inclined surface from the lower end side (FIG. 3) thereof while sliding up the inclined surface forming the press portion 21.

Figure 8:
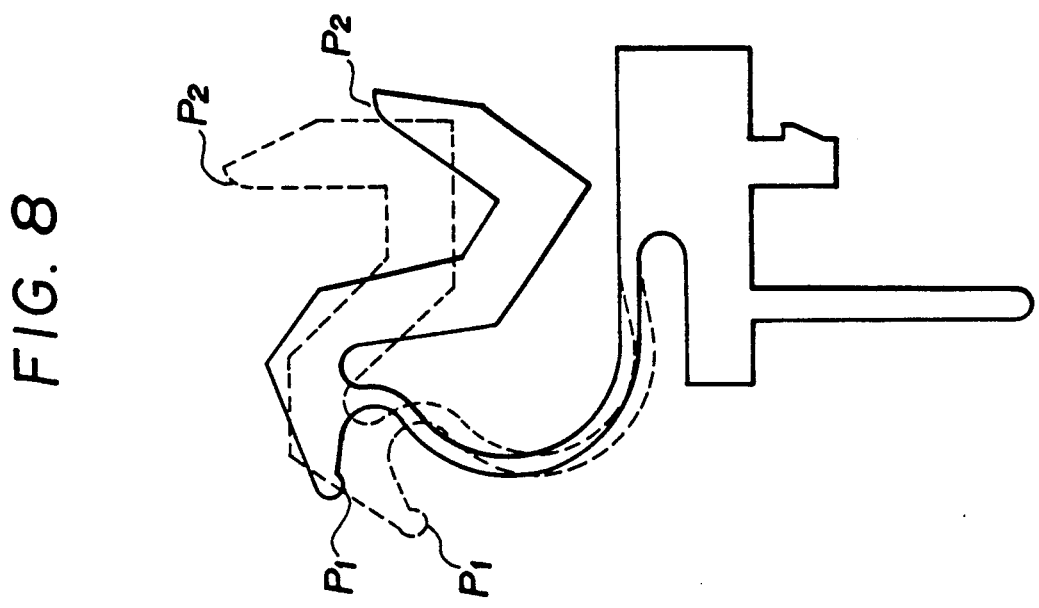
FIG. 8 is a side view showing the contact of FIG. 7 displacing backward and downward.

More specifically, when a press force is applied to the pressing force receiving portion 11 as shown in FIGS. 7 and 8, the press point $P_2$ causes the curved spring piece 6 to be displaced against its resilience, and at the same time it causes the cantilever arm 10 to be displaced backward and downward in the arrow $W_1$ direction, with an orbit from an upper position (press start point), past an upper dead point of a circle about the contact point $P_1$, toward back of the side dead point, and it also causes the contacting piece portion 8 to be separated from the terminal member 3 without fail. Preferably the cantilever arm 10 and the contacting piece portion 8 are rigid with respect to the pressing force.

At this time, although a push-down force is applied to the press point $P_2$ in the vertical direction as shown by the arrow $W_2$, this press force does not act as a force for pushing down the contact point $P_1$ in the vertical direction, but rather effectively acts as a component of force for displacing the press point $P_2$ backward and downward in the direction shown by the arrow $W_1$, and displacing the contact point $P_1$ backward and upward. The arrow $W_2$ shows the moving direction of the press portion 21.

In the above-mentioned embodiment, although the press portion 21 is formed into an inclined surface so as to enhance the backward and downward displacement, the press portion 21 may be formed into a generally horizontal surface for applying a press force to the pressing force receiving portion 11 to obtain the backward and downward displacement.

In this way, as is shown in FIG. 4, there is formed a state where the contacting piece portion 8 is sufficiently separated from the IC package 2, so as not to interfere therewith. When the push-down force on the push-down operating portion 18 of the contact shutter member 12 is removed, the shutter member 12 is lifted up a predetermined amount by the restoring force of the curved spring pieces 6 of the contacts 4 and the cantilever arms 10 to wait for the next push-down operation. As a result of the restoring force, the contact 4 causes the contacting piece portion 8 to be displaced forward and downward so that the contacting lug 9 is contacted with the upper surfaces of the front end portions of the terminal member 3 under a predetermined contact pressure applied from above at angles as shown by the arrow $W_3$. This contact pressure is the sum of the resilient force which is stored beforehand and the resilient force generated in accordance with the thickness of the terminal member 3.

As a result, the IC package 2 is held between the terminal supporting seat 16 or the contact piece 22 and the contacting lug 9 of the contacting piece portion 8, and held by the socket body 1.

When the push-down operating portion 18 of the contact shutter member 12 is pushed down again from the above-mentioned contacting state, the contact 4 is displaced backward and downward in the same manner as described and is brought to be in non-interference position with respect to the IC package 2 by removing contact with the IC package 2. In the foregoing state, the IC package 2 is mounted and removed.

The push-down operation of the contact shutter member 12 can be performed by the simplest vertical motion of a manipulator of a robot.

A manipulator is shown in FIG. 1 and includes push-down force rendering portions 23 for rendering a push-down force on the push-down operation portion 18 and an IC attracting portion 24 disposed at an intermediate portion of the push-down force rendering portions 23. While pushing down the upper surface of the push-down operating portion with the push-down force rendering portion 23, the IC attracting portion 24 attracts the upper surface of the body of the IC package 2 so as to mount it on the IC mounting portion 14 or remove it therefrom. Furthermore, the manipulator includes a pair of positioning pins 25 disposed on both sides of the attracting portion 24. A wall defining the IC accommodating window 13 of the contact shutter member 12, for example, the wall connecting the push-down operating portion 18, is provided with positioning holes 26 corresponding to the positioning pins 25. When the IC package 2 is to be mounted and removed, the positioning pins 24 are correctly brought into the positioning holes 26 by lowering the manipulator, and the mounting position of the IC package 2 is established with respect to the socket. Thereafter, by releasing the attraction of the IC attracting portion 24, the IC package 2 is mounted at a predetermined position of the IC mounting portion 14 so as to realize the corresponding relation between the contacts 4 and the terminal members 3.

In the above-mentioned embodiment, there was exemplified a case where the contacts 4 were juxtaposed on the opposite two sides of the IC mounting portion 14 of the socket body 1. However, the present invention is likewise applicable to a case where the contacts 4 are juxtaposed on the opposite two sides and two ends. In this case, the push-down operating portions 18 of the contact shutter member 12 may be disposed on every side of the IC accommodating window 13 in such a manner as to correspond to the contacts 4. The positioning holes 26 may be disposed in optional positions of the partition wall, including the diagonal lines of the IC accommodating window 13.

According to the present invention, a press force is applied to the pressing force receiving portion extending backward of the contacting piece portion through the cantilever arm and disposed in a higher position than the contact point of the contacting piece portion. The pressing force receiving portion displaces the cantilever arm while displacing the curved spring against its resilience through the cantilever arm and displaces it backward and downward with the orbit from a position past the upper dead point of a circle about the contact point of the contacting piece portion toward the back of the side dead point (backward of the contacts). It can favorably convert the press force into the backward and upward displacement of the contacting piece portion following the backward and downward displacement. As a result, the terminal members can be separated from the contacting piece portions without fail so as to facilitate the mounting and removing of the IC package.

According to the present invention, as the press force can be favorably converted into the backward and upward displacement of the contact by applying a press force to the pressing force receiving portion, sufficiently separated from the contacting piece portion through the cantilever arm as mentioned, a sufficient backward and upward displacement of the contact can be ensured by a limited push-down amount of the contact shutter member.

Furthermore, according to the present invention, a harmful component of force for vertically pushing down the contacting piece portion can be effectively prevented from occurring owing to the multiplicative function of the cantilever arm and the curved spring piece, and a correct non-interfering position with respect to the IC package can be obtained. In addition, the push-down operating force can be reduced.

Furthermore, by virtue of the above-mentioned construction, as the push-down operation can be effected in the upper space of the contact without any requirement for inserting the press portion of the contact shutter member deep into the socket body, the present invention contributes to the small size and the simple design of the device.

Numerous characteristics and advantages of the present invention have been set forth in the foregoing description, together with details of the structure and function of the present invention. The disclosure, however, is illustrative only, and changes may be made within the principle of the present invention to the full extent indicated by the appended claims.

We claim:

1. An IC socket, comprising:
   a socket body having an IC package accommodating portion;
   a plurality of contacts disposed in said socket body for contacting terminal members of an IC package; and
   a contact shutter member vertically movably mounted on said socket body for pushing said contacts such that said contacts move upward and backward from the terminal members of an IC package upon movement of said contact shutter member toward said socket body;
   wherein each said contact comprises a fixing portion for fixing the contact in said socket body, a contact portion for contacting a terminal member, and means for causing said contact portion of said contact to move upward and backward from a first terminal member contact position to a second terminal member non-contact position in response to vertical movement of said contact shutter member toward said socket body, said means comprising a curved spring extending forward toward said IC package accommodating portion from said fixing portion to said contact portion, said curved spring having a double curve with a first concave portion adjacent said fixing portion facing away from said contact portion and a second concave portion adjacent and facing toward said contact portion, and a cantilever arm extending backward from said contact portion, said cantilever arm having a free end, said free end comprising a pressing force receiving portion for being pressed by said contact shutter member; and
   wherein each said contact portion of said contacts has a forward end projecting forward in the direction of said IC package accommodating portion and said curved spring has a forwardmost portion at said first concave portion extending forward in the direction of said IC package accommodating portion, said forward end of said contact portion extending further forward than said forwardmost portion of said curved spring in said first terminal member contact position.

2. The IC socket of claim 1, wherein:
   said pressing force receiving portion of said cantilever arm of each said contact is located behind said curved spring, with respect to the direction of said IC package accommodating portion.

3. The IC socket of claim 1 and further comprising:
   a substantially vertically extending member in said socket body having an upper portion defining a terminal member supporting seat and a side portion disposed in front of said curved spring of said contact and defining a forward movement limit point of said curved spring.

4. The IC socket body of claim 3, wherein said substantially vertically extending member is an integral part of said socket body.

5. The IC socket of claim 3, wherein said substantially vertically extending member is an integral part of said contact.

* * * * *